(12) United States Patent
Schmitt et al.

(10) Patent No.: US 8,405,435 B2
(45) Date of Patent: Mar. 26, 2013

(54) DELAY LOCKED LOOP HAVING INTERNAL TEST PATH

(75) Inventors: Jonathan Schmitt, Eden Prairie, MN (US); Roger L. Roisen, Minnetrista, MN (US)

(73) Assignee: LSI Corporation, Milpitas, CA (US)

( * ) Notice: Subject to any disclaimer, the term of this patent is extended or adjusted under 35 U.S.C. 154(b) by 1636 days.

(21) Appl. No.: 10/985,289

(22) Filed: Nov. 10, 2004

(65) Prior Publication Data

US 2006/0097763 A1 May 11, 2006

(51) Int. Cl.
*H03L 7/06* (2006.01)
(52) U.S. Cl. .......................................... 327/158
(58) Field of Classification Search ............... 327/158
See application file for complete search history.

(56) References Cited

U.S. PATENT DOCUMENTS

| | | | | |
|---|---|---|---|---|
| 5,118,975 A | * | 6/1992 | Hillis et al. | 327/158 |
| 5,663,665 A | * | 9/1997 | Wang et al. | 327/3 |
| 6,177,844 B1 | * | 1/2001 | Sung et al. | 331/57 |
| 6,208,183 B1 | * | 3/2001 | Li et al. | 327/161 |
| 6,326,812 B1 | * | 12/2001 | Jefferson | 326/93 |
| 6,351,191 B1 | * | 2/2002 | Nair et al. | 327/158 |
| 6,476,594 B1 | | 11/2002 | Roisen | 324/76.54 |
| 6,642,761 B1 | * | 11/2003 | Tien | 327/158 |
| 6,721,379 B1 | * | 4/2004 | Cranford et al. | 375/376 |
| 6,727,737 B2 | * | 4/2004 | Trivedi et al. | 327/158 |
| 6,756,853 B2 | | 6/2004 | Schmitt et al. | 331/57 |
| 6,836,166 B2 | * | 12/2004 | Lin et al. | 327/158 |
| 6,867,627 B1 | * | 3/2005 | Murtagh | 327/158 |
| 6,937,530 B2 | * | 8/2005 | Bell | 365/194 |
| 2005/0127964 A1 | * | 6/2005 | Lee | 327/158 |

OTHER PUBLICATIONS

Rabaey, Jan M., "Digital Integrated Circuits a Design Perspective", Prentice Hall Inc., 1996, pp. 135.*

* cited by examiner

*Primary Examiner* — Lincoln Donovan
*Assistant Examiner* — Khareem E Almo
(74) *Attorney, Agent, or Firm* — David D. Brush; Westman, Champlin & Kelly, P.A.

(57) ABSTRACT

A delay locked loop generates a voltage on a common node as a function of a phase difference between a reference input and a feedback input. A first voltage-controlled delay line coupled between the reference input and the feedback input and has a first delay, which is controlled by the voltage on the common node. A second voltage-controlled delay line is selectively coupled in series with the first delay line, between the reference input and the feedback input, as a function of a test control input. The second delay line has a second delay, which is controlled by the voltage on the common node.

15 Claims, 7 Drawing Sheets

DELAY LOCKED LOOP HAVING INTERNAL TEST PATH

CROSS-REFERENCE TO RELATED APPLICATION

Cross-reference is made to U.S. application Ser. No. 09/879,416, filed on Jun. 12, 2001 and entitled "DELAY-LOCKED LOOP WITH BUILT-IN SELF-TEST OF PHASE MARGIN", which is assigned to the same assignee.

FIELD OF THE INVENTION

The present invention relates to semiconductor integrated circuits and, more particularly to a delay locked loop fabricated on an integrated circuit.

BACKGROUND OF THE INVENTION

Delay locked loops (DLLs) are used in integrated circuits for removing phase differences between clock signals, such as phase differences caused by propagation delay. For example, DLLs are often used in clock trees for aligning the phase of an input reference clock with the phase of an output of the clock tree.

A typical DLL includes a phase detector, a charge pump, a loop filter and a voltage-controlled delay line. The phase detector detects a phase difference between a reference clock signal and a feedback clock signal. The phase detector generates a phase control signal as a function of the phase difference and applies the phase control signal to the charge pump, which increases, decreases or does not change a voltage across the loop filter. The loop filter voltage is applied to the voltage-controlled delay line for controlling the propagation delay through the delay line. The reference clock is fed through the delay line to generate an output clock, which is fed back to the phase detector as the feedback clock. The delay line advances or retards the phase of the output clock until the phase of the feedback clock matches the phase of the reference clock. The DLL has then locked the output clock signal onto the phase of the reference clock signal.

Once an integrated circuit having an embedded DLL has been fabricated, the operation of the DLL is tested for fabrication faults and changes in operating characteristics due to variations in process, supply voltage and temperature, which are known as "PVT". Fabrication faults can affect the functionality of a DLL. Similarly, the phase margin of a DLL can vary as much as a factor of two or more from one integrated circuit to the next due to variations in PVT. Variations in the phase margin that exceed specified margins can lead to difficulties in clock synchronization and other functions commonly performed by DLLs.

An embedded DLL is tested by applying a test clock signal to the reference input of the DLL and then measuring the resulting frequency at the output of the DLL. However, a DLL normally requires that the test clock signal be within the DLL's "locking range" in order to lock the output clock signal onto the phase of the test clock signal. As the operating frequencies of DLLs continue to increase, it is becoming more difficult to provide a DLL with a test clock signal that is within the locking range. For example, the operating frequency of a DLL may be 300-500 MHz while the desired testing frequency may be 30 MHz. Therefore in order to test a DLL at the desired testing frequency, logic designers have been required to build delay lines, such as large strings of inverters, into the feedback path in order to slow the operating frequency of the DLL. These large strings of inverters consume a relatively large area on the integrated circuit, and it is often difficult to achieve the correct delay. Further, the logic cells used to build the delay line have delays that vary with PVT, which can result in an inaccurate and unreliable test.

Improved test methods and circuits are desired for testing embedded DLLs.

SUMMARY OF THE INVENTION

One embodiment of the present invention is directed to a delay locked loop. The delay locked loop includes a phase detector having a reference input, a feedback input and a charge control output. A charge pump is coupled between the charge control output and a common node. A loop filter is coupled to the common node. A first voltage-controlled delay line is coupled between the reference input and the feedback input and has a first delay, which is controlled by the common node. A second voltage-controlled delay line is selectively coupled in series with the first delay line, between the reference input and the feedback input, and has a second delay, which is controlled by the common node.

Another embodiment of the present invention is directed to a delay locked loop, which includes a circuit for generating a voltage on a common node as a function of a phase difference between a reference input and a feedback input. A first voltage-controlled delay line is coupled between the reference input and the feedback input and has a first delay, which is controlled by the voltage on the common node. The delay locked loop also includes a second voltage-controlled delay line having a second delay, which is controlled by the voltage on the common node. The second delay line is selectively coupled in series with the first delay line, between the reference input and the feedback input, as a function of a test control input.

Another embodiment of the present invention is directed to a method of testing a delay locked loop, which generates a voltage on a common node as a function of a phase difference between a reference input and a feedback input. The voltage on the common node controls a first voltage-controlled delay line coupled in a feedback loop between the reference input and the feedback input. The method includes: (a) decoupling a normal reference signal from the reference input; (b) coupling a test signal to the reference input in replace of the normal reference input, wherein the test signal has a lower frequency than the normal reference signal; (c) coupling a second voltage-controlled delay line in series with the first voltage-controlled delay line, wherein the first and second delay lines each have a delay control input coupled to the common node; and (d) testing operation of the delay locked loop with the test signal when the first and second delay lines are in series with one another.

DETAILED DESCRIPTION OF ILLUSTRATIVE EMBODIMENTS

Figure 1:
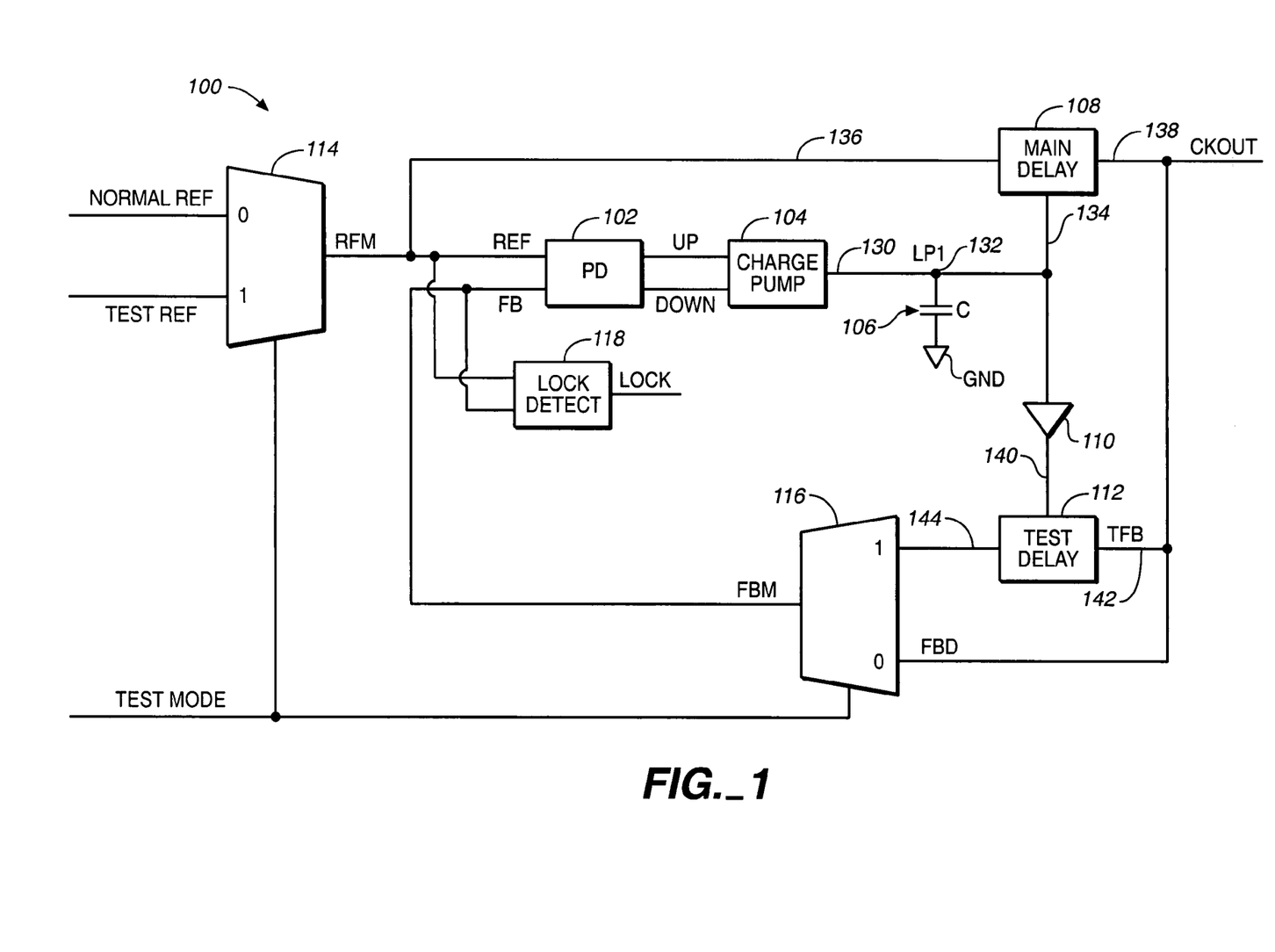
FIG. 1 is a block diagram illustrating a delay locked loop according to one embodiment of the present invention.

FIG. 1 is a block diagram illustrating a delay locked loop (DLL), which is capable of being tested at a substantially lower testing frequency than a normal operating frequency of the DLL, according to one embodiment of the present invention.

DLL 100 includes phase detector 102, charge pump 104, loop filter 106, voltage-controlled main delay line 108, analog buffer 110, voltage-controlled test delay line 112, test multiplexers 114 and 116 and lock detect circuit 118. Multiplexer 114 selects between a normal reference clock input NORMAL REF and a test clock input TEST REF as a function of a test mode control input TEST MODE. The selected reference clock is applied to the output of multiplexer 114 (labeled "RFM"), which is coupled to the inputs of phase detector 102 and main delay line 108.

Phase detector 102 receives the selected reference clock signal on reference input REF. Phase detector 102 also includes a feedback clock input FB and charge pump control outputs UP and DOWN. Control outputs UP and DOWN are coupled to the inputs of charge pump 104. Charge pump 104 has an output 130, which is coupled to a common, loop filter node 132 (labeled "LPf"). Loop filter 106 is formed by a capacitor "C", which is coupled between loop filter node 132 and ground terminal GND. The main delay line 108 is coupled between reference output RFM and clock output CKOUT. Delay line 108 includes a propagation delay control input 134, which is coupled to the loop filter node 132. Output 138 of delay line 108 is also coupled in a feedback loop to feedback input FB of phase detector 102, through test multiplexer 116.

Test multiplexer 116 has a first input coupled to output 138 of main delay line 108, a second input coupled to the output of test delay line 112, an output coupled to feedback input FB of phase detector 102, and a select input coupled to TEST MODE.

In the normal operating mode, TEST MODE is inactive such that test multiplexer 114 couples the normal reference input NORMAL REF to the reference input REF of phase detector 102 and to the input of main delay line 108. Test multiplexer 116 couples the output of delay line 108 directly to the feedback input FB of phase detector 102, thereby bypassing test delay line 112. Phase detector 102 detects a phase difference between the reference clock applied to REF and a feedback clock applied to FB. Phase detector 102 generates "UP" and "DOWN" control signals on outputs UP and DOWN as a function of the difference. The "UP" and "DOWN" control signals are applied to charge pump 104, which cause charge pump 104 to increase, decrease or not change the voltage on loop filter 106.

The main voltage-controlled delay line 108 includes one or more delay elements, which are coupled together in series between input 136 and output 138. Main delay line 108 adjusts the propagation delay through each of these delay elements as a function of the voltage applied to delay control input 134, from loop filter node 132. The output clock signal generated on clock output 138 is fed back to phase detector 102 as the feedback clock signal on feedback input FB. Phase detector 102 and charge pump 104 continue to adjust the loop filter voltage and therefore the propagation delay through delay line 108 until the phase of the feedback clock signal matches the phase of the reference clock signal. A lock detect circuit 118 can be provided for detecting a lock condition between the reference clock signal and the feedback clock signal based on the phase difference between REF and FB. Lock detect circuit 118 generates a lock signal LOCK, which indicates whether the lock condition has been satisfied.

In a typical DLL circuit there can be one or more logic elements coupled between clock output CKOUT and feedback input FBD of multiplexer 116. DLL 100 would be used to remove any phase error caused by propagation delay and loads within these elements. For example, clock output CKOUT can be used to feed a binary clock tree on the integrated circuit, which distributes the output clock to the various sequential elements on the integrated circuit in one or more clock domains. One of the taps of the binary clock tree could be fed back to feed back input FBD so DLL 100 could remove any phase error or "clock skew" between that clock tap and the reference clock. In addition, DLL 100 can be used in many other applications.

In some applications, DLL 100 can have a very high operating frequency, such as between 300 MHz and 500 MHz. Such a high operating frequency makes it difficult to test the functionality of the DLL. A DLL normally requires the test clock signal to be within the DLL's "locking range" in order to lock the output clock signal onto the phase of the test clock signal. As the operating frequencies of DLLs continue to increase, it becomes more difficult for internal or external test circuits to provide a DLL with a test clock signal that is within the locking range. Therefore, it is desirable to slow the DLL to a lower operating frequency and a lower locking range during testing.

In the embodiment shown in FIG. 1, the TEST MODE control input is used to switch DLL 100 from the normal operating mode to a test operating mode. When TEST MODE is active, test multiplexer 114 couples the test reference clock TEST REF to the reference input of phase detector 102. Test multiplexer 116 couples the test delay line 112 in series with the main delay line 108 within the feedback loop.

In one embodiment, test delay line 112 has a significantly longer propagation delay than the main delay line 108. For example, if the normal reference clock input has a frequency of 500 MHz, main delay line 108 has a propagation delay approximately of 2.0 nanoseconds and the test reference clock has a frequency of 30 MHz, then it would be desirable for the test delay line 112 to have a propagation delay of approximately of 32 nanoseconds to achieve an overall total feedback delay of 34 nanoseconds. Of course, other values can be used in alternative embodiments of the present invention. By inserting test delay line 112 into the feedback loop, DLL 100 has a significantly lower operating frequency, such as 30 MHz, in the test operating mode. This allows DLL 100 to be easily tested for fabrication faults and appropriate functionality over various process, voltage and temperature (PVT) conditions.

Test delay line 112 is a voltage-controlled delay line having a propagation delay control input 140, which is coupled to the common, loop filter node 132. The additional load added by delay line 112 can be isolated from loop filter node 132 by an analog buffer 110, for example. Similar to the main delay line 108, test delay line 112 includes one or more delay elements, which are coupled together in series between clock input 142 and clock output 144. Test delay line 112 adjusts the propagation delay through each of these delay elements as a function of the voltage on loop filter node 132. Therefore, the control voltage that compensates the delay through the main delay line 108 during normal operation for changes in PVT also compensates the delay through test delay line 112 during the test mode to provide accurate and reliable test measurements.

Figures 2, 2B:
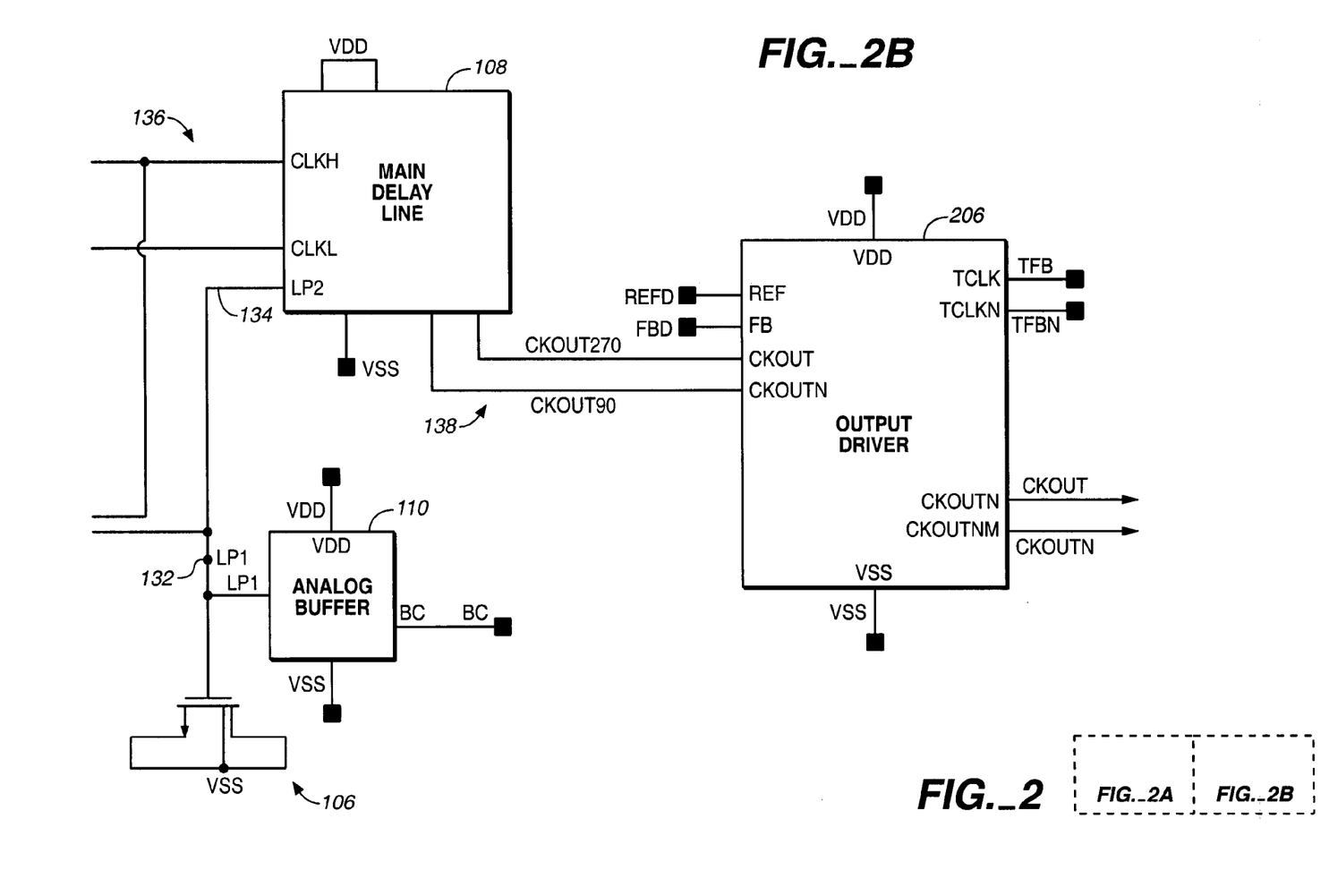
FIG. 2 is a block diagram of a specific implementation of the delay locked loop shown in FIG. 1, according to one embodiment of the present invention.
Figure 2A:
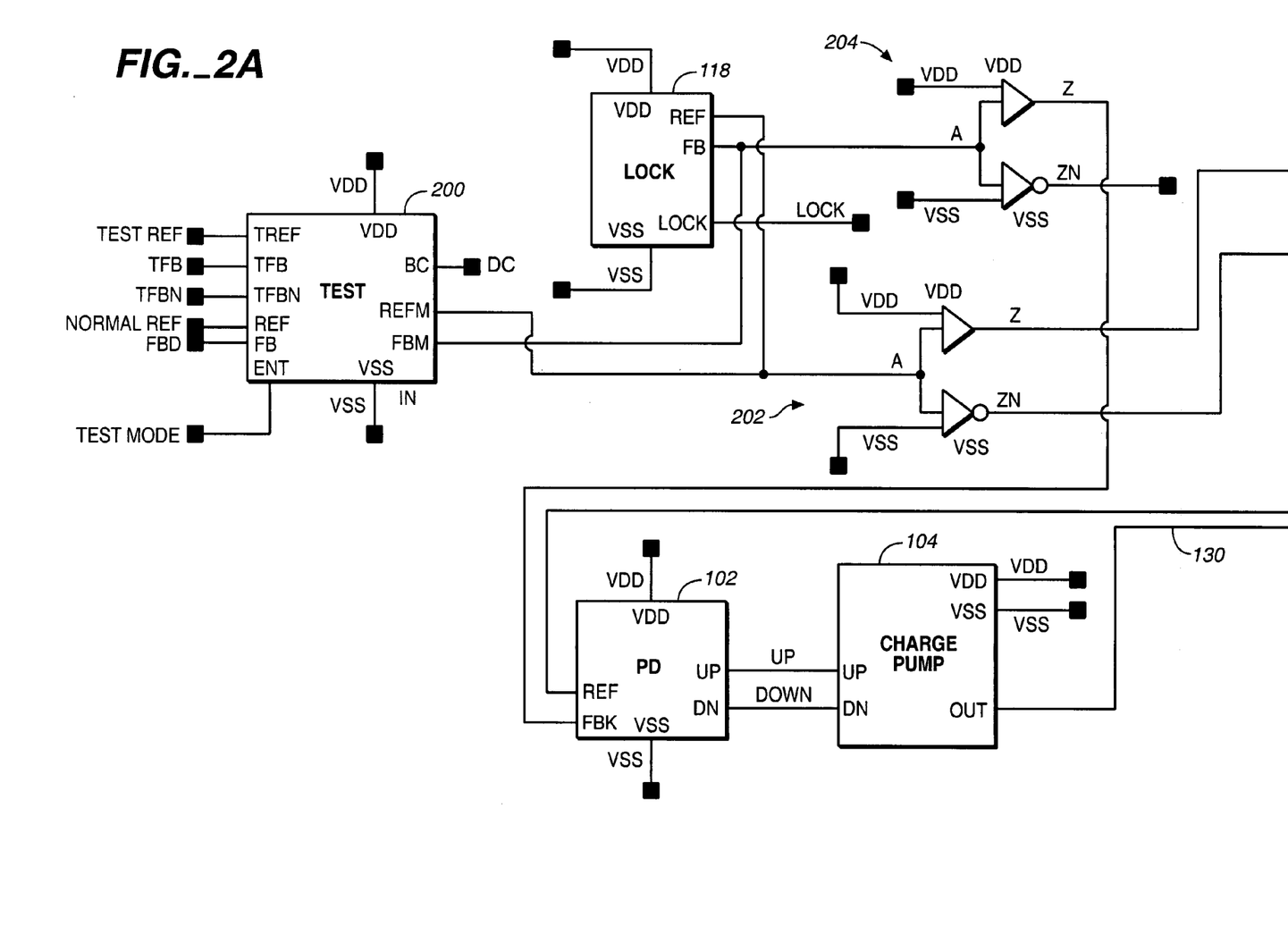

FIG. 2 is a block diagram illustrating a more detailed implementation of DLL 100, according to one embodiment of the present innovation. The same reference numerals are used in FIG. 2 as were used in FIG. 1 for the same or similar elements.

Figure 3:
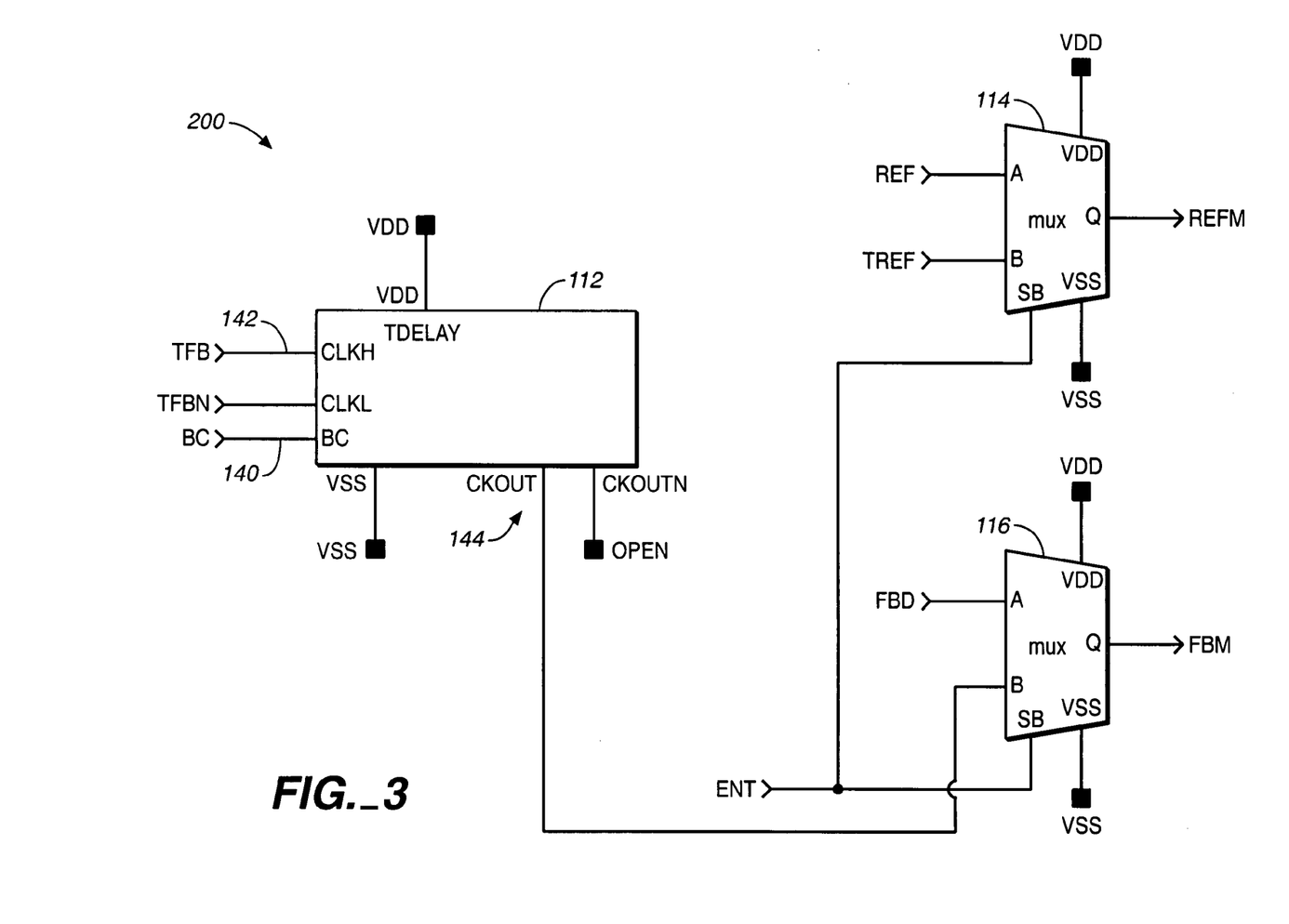
FIG. 3 is a block diagram of a test block in the DLL shown in FIG. 2.

DLL 100 includes a test block 200, which includes the test delay line 112 and the test multiplexers 114 and 116 and shown in greater detail in FIG. 3. The elements of test block 200 are biased between voltage supply terminals VDD and VSS. Test block 200 receives the NORMAL REF and TEST REF signals on inputs REF and TREF, respectively. Test block 200 also receives true and complement feedback clocks TFB and TFBN and a further feedback clock FBD from output driver 206. These signals are similar signals derived from the output of the main delay line 108, but are generated as separate signals by output driver 206. Test block 200 receives test mode enable TEST MODE on input ENT and a buffered control voltage BC from to analog buffer 110.

Test block 200 is shown in greater detail in FIG. 3. Test block 200 includes test delay line 112 and test multiplexers 114 and 116. Test delay line 112 receives the complementary clock inputs TFB and TFBN on clock inputs 142 and produces complementary clock outputs CKOUT and CKOUTN on outputs 144. Delay line 112 receives the buffered control voltage BC on control input 140, which controls the propagation delay through test delay line 112. The "true" version of the clock output, CKOUT, is coupled to one input of multiplexer 116. The other input of multiplexer 116 is coupled to the normal feedback signal FBD from the main delay line 108 (shown in FIGS. 1 and 2). Multiplexer 116 multiplexes the feedback signal FBD from the main delay line or CKOUT from the test delay line to feedback output FBM, as a function of the test mode enable input ENT. Similarly, multiplexer 114 multiplexes the normal reference clock input REF or the test clock input TREF onto reference output REFM as a function of the test mode enable input ENT.

Referring back to FIG. 2, the selected reference clock signal REFM and feedback clock signal FBM from test block 200 are coupled to lock detect circuit 118, which produces lock output LOCK as a function of the phase delay between the two signals. These signals are also coupled to buffer circuits 202 and 204, which produce true and complement versions of the signals and serve to balance loads in the circuit. The true and complement reference clock signals from buffer circuit 202 are coupled to corresponding true and complement inputs of main delay line 108.

Main delay line 108 has a delay control input 134 (labeled "LP2"), which is coupled to loop filter node 132 for receiving the voltage developed on loop filter capacitor 106. Main delay line 108 produces complementary, delayed clock signals CKOUT90 and CKOUT270 on clock outputs 138. These clock outputs are provided to the inputs of output driver 206. Output driver 206 has separate output drivers for producing complementary clock outputs CKOUT and CKOUTN for the integrated circuit, complementary feedback clock signals TFB and TFBN for the test delay line, and the normal feedback signal FBD for the test multiplexer. These signals are generated based on CKOUT90 and CKOUT270.

The "true" versions of the reference clock signal and the feedback clock signal from buffer circuits 202 and 204 are also applied to the inputs of phase detector 102, which produces the UP and DOWN control signals for charge pump 104. Charge pump 104 pumps charge onto or off of loop filter node 132 as a function of the UP and DOWN signals.

Loop filter 106 is coupled between loop filter node 132 and ground terminal VSS. Analog buffer 110 buffers the voltage on loop filter node 132 and produces a similar voltage on output BC, which is used by the test delay line 112 (FIG. 3) for controlling the propagation delay.

Figures 4, 4B:
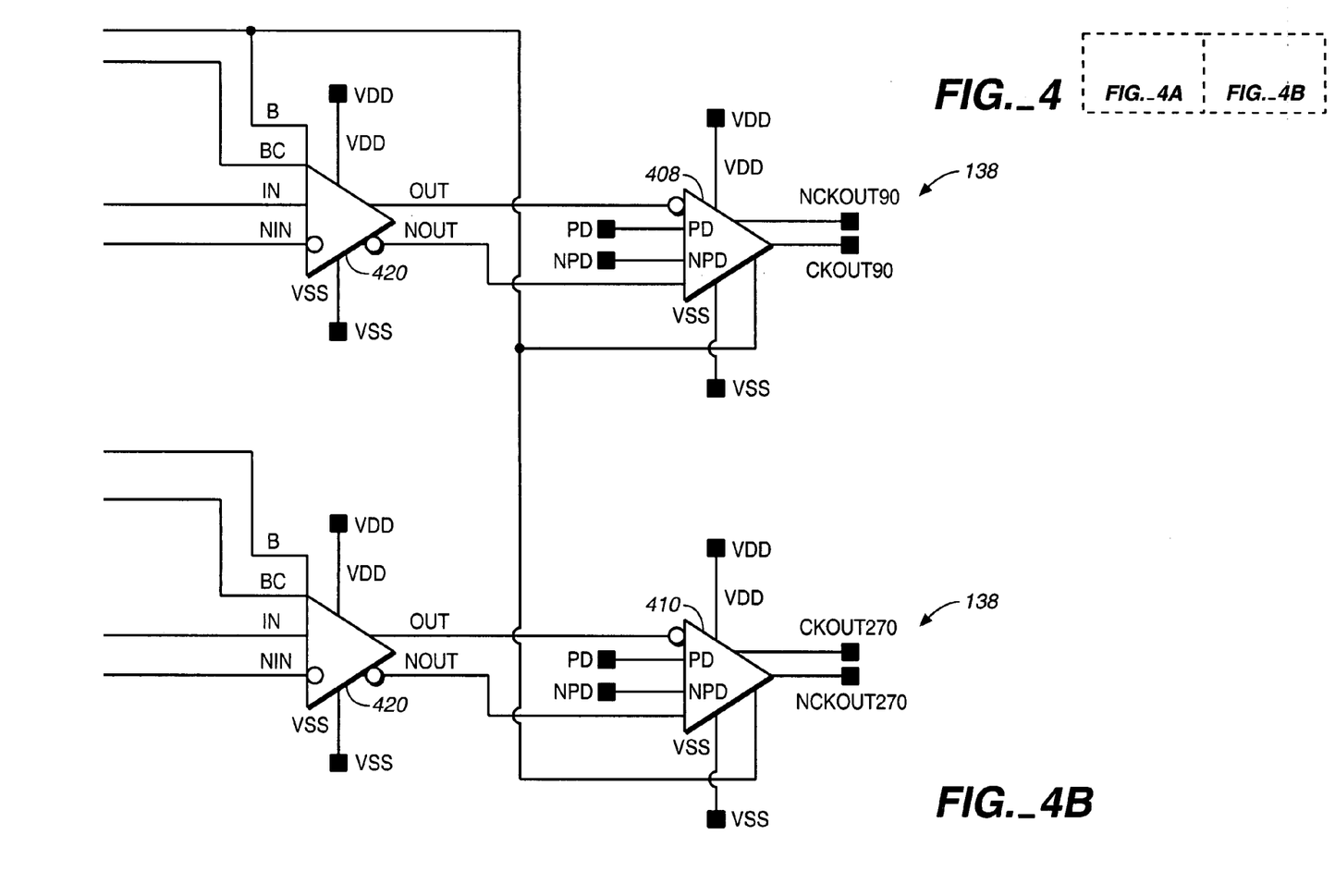
FIG. 4 is a schematic diagram illustrating a main delay line in the DLL shown in FIG. 2.
Figure 4A:
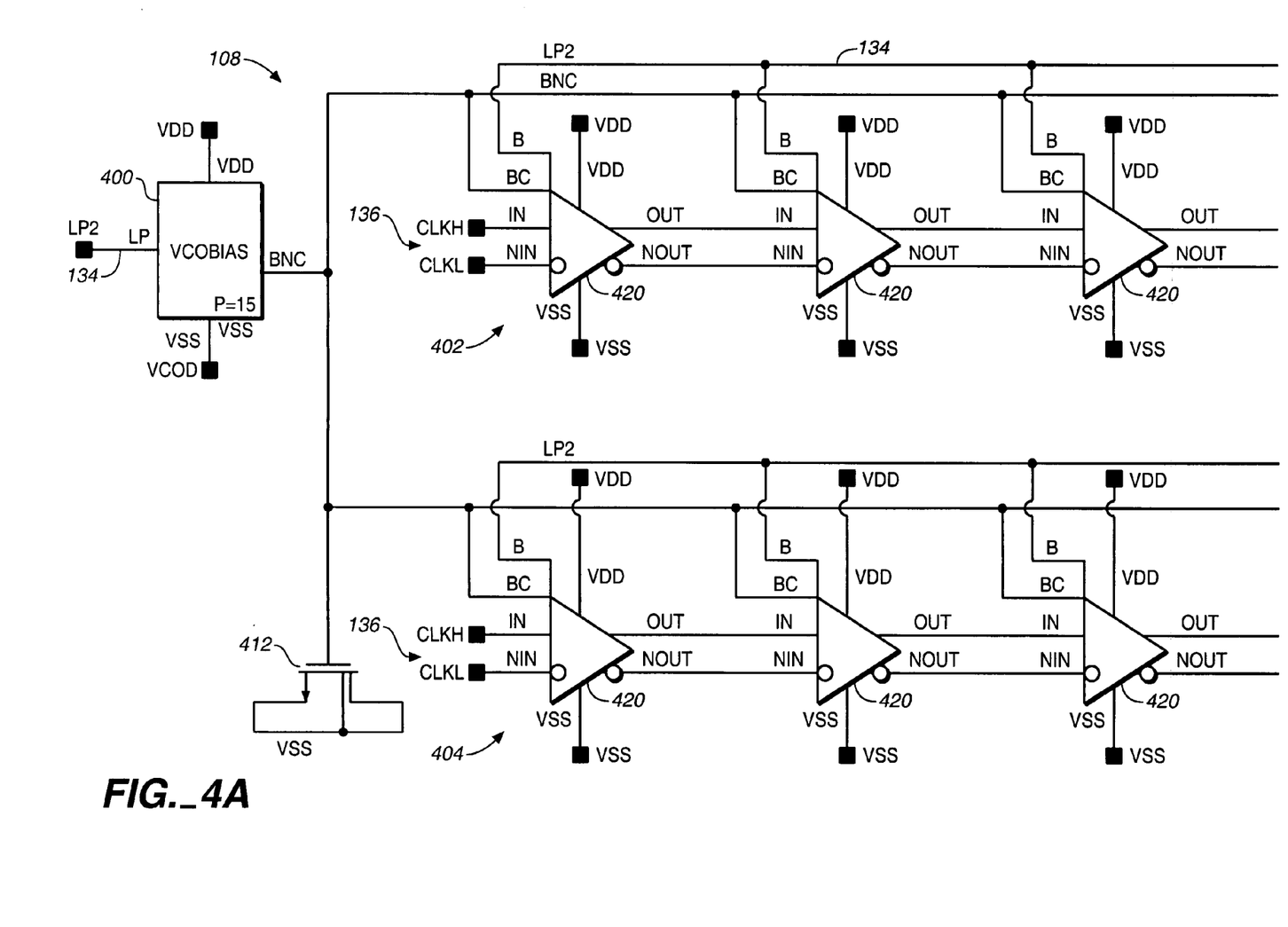

FIG. 4 is a schematic diagram illustrating main delay line 108 in greater detail, according to one embodiment of the present invention. Delay line 108 includes a voltage bias circuit 400, first and second parallel delay lines 402 and 404, and corresponding level shifters 408 and 410. The true and complement reference clock signals received on clock inputs 136 are labeled "CLKH" and "CLKL". The loop filter control voltage is received on delay control input 134, which is labeled "LP2".

Voltage bias circuit 400 receives the loop filter voltage on input LP2 and generates a corresponding "bias copy" voltage BNC, which has a slightly higher voltage than LP2. The control voltage BNC is developed across capacitor 412.

Each delay line 402 and 404 includes a string of four delay cells 420, which are connected with series with one another. Each delay cell 420 has a pair of complementary clock inputs IN and NIN, a pair of complementary clock outputs OUT and NOUT, and a pair of complementary delay control inputs B and BC. The control inputs B and BC are coupled to control voltage nodes LP2 and BNC, respectively. Each delay cell 420 has a propagation delay that is a function of the voltages applied to B and BC. The outputs of the last delay cell 420 in each string are applied to the inputs of a corresponding level shifter 408 and 410. Level shifters 408 and 410 convert the outputs OUT and NOUT from delay cells 420 to substantially rail-to-rail voltage supply levels.

In the example should in FIG. 4, main delay line 108 is a four stage delay with four delay cells 420 in each string. However, any number of delay cells 420 can be used in alternative embodiments of the present invention. Also, different configurations and types of delay cells can be used in alternative embodiments, and level shifter 408 and 410 may or may not be required depending on the particular application. The use of two delay strings 402 and 404 allows one string to operate on the positive clock edge and the other to operate on the negative clock edge to obtain a 50% duty cycle. However, the main delay line 108 can include a single delay string in an alternative embodiment of the present invention.

Figure 5:
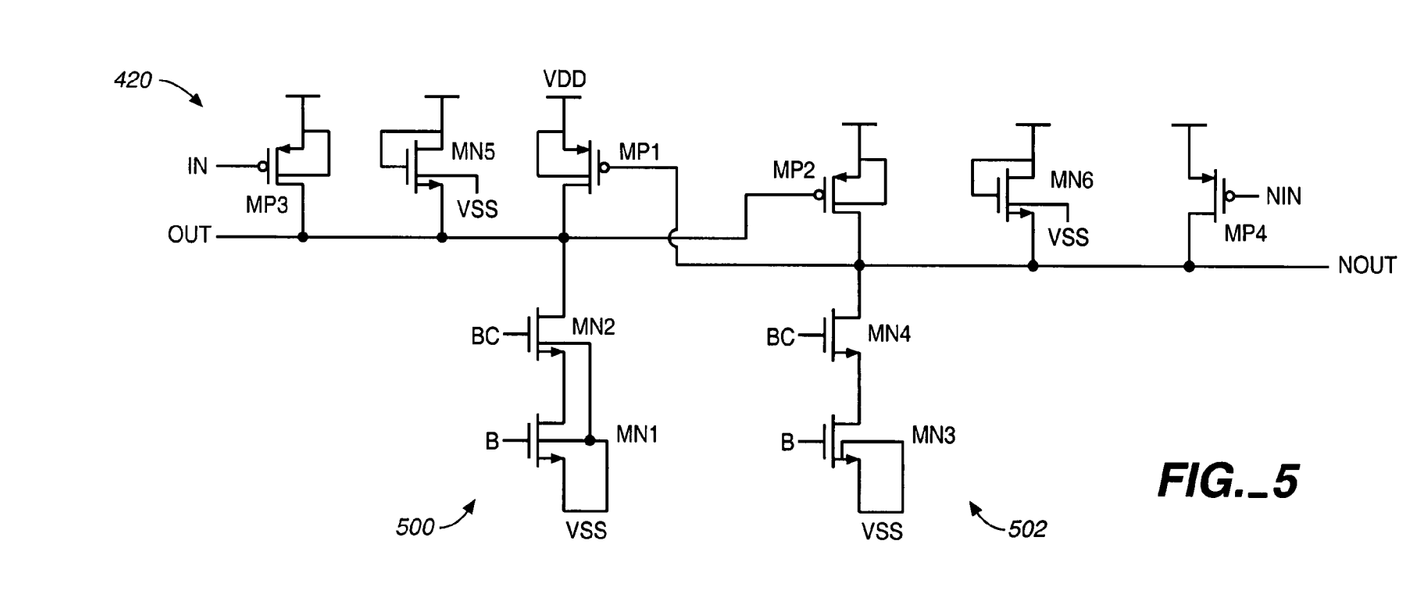
FIG. 5 is a schematic diagram illustrating a delay cell within the main delay line shown in FIG. 4.

FIG. 5 is a schematic diagram illustrating one of the voltage-controlled delay cells 420 in greater detail. Delay cell 420 includes N-channel transistors MN1-MN6 and P-channel transistors MP1-MP4. Transistors MN1 and MN2 form a current source 500 for a first leg of cross-coupled transistor pair MP1 and MP2. Transistors MN3 and MN4 form a current source for a second leg of the cross-coupled transistor pair MP1 and MP2.

Transistors MN1 and MN2 are coupled in casode with one another. The gate of MN1 is coupled to control voltage input B and the gate of MN2 is coupled to control voltage input BC. MN1 has a source coupled to VSS and a drain coupled to the source of MN2. MN2 has a drain coupled to output OUT and the drain MP1.

Similarly, transistors MN3 and MN4 are coupled in cascode with one another. The gate of MN3 is coupled to control voltage input B and the gate of MN4 is coupled to control voltage input BC. MN3 has a source coupled to VSS and a drain coupled to a source of MN4. The drain of MN4 is coupled to output NOUT and the drain of MP2.

Transistor MP1 has a gate coupled to NOUT, a source coupled to VDD and a drain coupled to OUT. Transistor MP2 has a gate coupled to OUT, a source coupled to VDD and a drain coupled to NOUT.

Pull-up transistor MP3 has a gate coupled to IN, a drain coupled to OUT, and a source coupled to VDD. Similarly, pull-up transistor MP4 has a gate coupled to NIN, a drain coupled to NOUT, and a source coupled to VDD.

When IN is low and NIN is high, MP3 is on and MP4 is off. MP3 pulls OUT high, turning off MP2. With MP2 off, MN3 and MN4 pull NOUT low, which turns on MP1. MP1 reinforces the high voltage on OUT. When IN is high and NIN is low, MP3 is off and MP4 is on. MP4 pulls NOUT high, thereby turning off MP1. With MP1 off, MN1 and MN2 pull OUT low, thereby turning on MP2, which reinforces the high voltage on NOUT.

The cross-coupled transistor pain MP1 and MP2 therefore change states as a function of the relative voltage levels on IN and NIN to thereby change the states on OUT and NOUT. The rate at which MP1 and MP2 can change states is controlled by the voltage levels applied to control inputs B and BC. These voltages therefore control the propagation delay through delay cell 420.

Transistors MN5 and MN6 are always in an on state and are used to control a voltage swing on OUT and NOUT. Transistor MN5 has a gate and drain coupled to VDD and a source coupled to OUT. Transistor MN6 has a gate and drain coupled to VDD and a source coupled to NOUT.

The delay cell shown in FIG. 5 is one example in a delay cell that can be used in an embodiment of the present invention. However, any other suitable delay cell can be used in alternative embodiments of the present invention.

The test delay line 112 can be constructed in a similar fashion, with similar delay cells 420 as shown in FIGS. 4 and 5. However, as described with reference to FIG. 1, the transistors in current sources 500 and 502 can be constructed with smaller gate widths than the corresponding transistors in the main delay line 108. This reduces the number of delay cells that are required to achieve the desired propagation delay through the test delay line. In the example described with reference to FIG. 1, the main delay line has a propagation delay of approximately of 2.0 nanoseconds and the test delay line has a propagation delay of 32 nanoseconds. The test delay line therefore has 16 times the propagation delay than the main delay line. If the current sources in the delay cells of the test delay line had the same size as those of the main delay line, the test delay line would require 54 delay cells in series with one another. However by reducing the gate widths of the current source transistors in the test delay line, the number of delay elements can be reduced. For example, if the current source transistors in the test delay line have ¼ the width of corresponding transistors in the main delay line, then the test delay line would require only 16 delay cells. Other ratios of transistor sizes can be used in alternative embodiments of the present invention.

Figure 6:
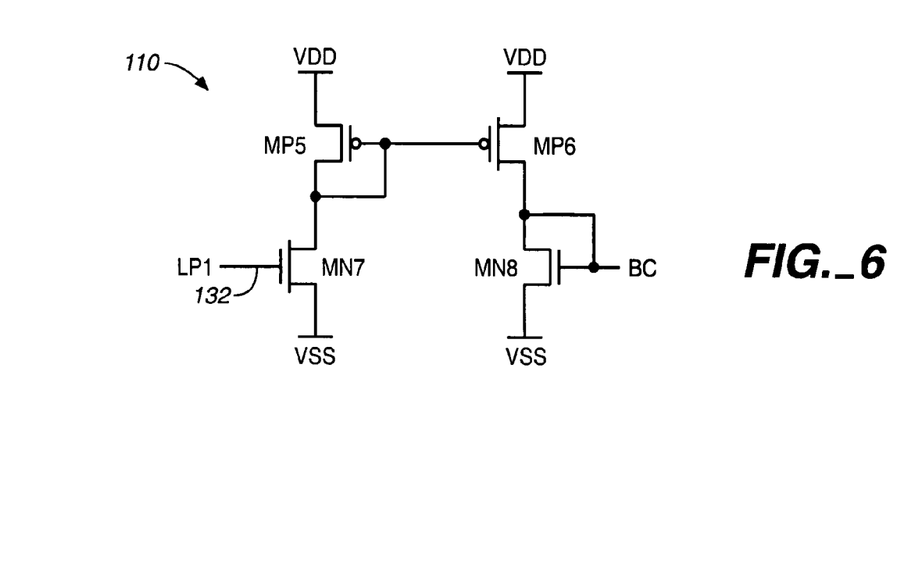
FIG. 6 is a schematic diagram illustrating an analog buffer within the DLL shown in FIG. 2.

FIG. 6 is a schematic diagram illustrating an example of an analog buffer 110, which can be used in the embodiments shown in FIGS. 1 and 2 for isolating the additional load of test delay line 112 from the common loop filter node 132. Analog buffer 110 includes N-channel transistors MN7 and MN8 and P-channel transistors MP5 and MP6. Transistor MN7 has a gate coupled to loop filter control node 132 (labeled "LP1"), a source coupled to VSS and a drain coupled to the gate and drain of MP5. Transistor MP5 has a source coupled to VDD. MP6 has a gate coupled to the gate of MP5, a source coupled to VDD and a drain coupled to the gate and drain of MN8. MN8 has a source coupled to VSS and a gate coupled to bias control node BC. Bias control node BC supplies the control voltage to the test delay line 112 shown in FIGS. 1 and 2.

During operation, the voltage on LP1 controls the current at the drain of MN7. Transistors MP5 and MP6 together form a current mirror, which mirrors the current on the drain of MN7 into the drain of MN8. MN8 produces substantially the same voltage on output BC as was applied to input LP1. Analog buffer 110 therefore replicates the bias control voltage while isolating the additional load of the test delay line from the loop filter node.

In one embodiment, if transistors MN7, MP5 and MP6 each have a gate width of four units and a gate length of one unit, transistor MN8 can include an array of four parallel-connected transistors having gate widths of one unit and gate lengths of one unit, for example. Other ratios and sizes can also be used.

With the embodiments described above, the DLL has a test operating mode with a substantially lower operating frequency than the normal operating frequency. The test clock signal is therefore easier to generate, thereby making the DLL easier to test. Also, since both the main delay line and the test delay line are voltage-controlled delay lines that receive control voltages from the loop filter, the propagation delays are automatically compensated for changes in PVT. This makes it easier to construct the test delay line with the appropriate delay and results in more accurate test measurements.

Although the present invention has been described with reference to preferred embodiments, workers skilled in the art will recognize that changes may be made in form and detail without departing from the spirit and scope of the invention.

What is claimed is:

1. A delay locked loop comprising:
   a test reference input;
   a normal reference input;
   a normal operating mode and a test operating mode;
   a test control input, which selects between the normal and test operating modes;
   a phase detector having a reference input, a feedback input and a charge control output;
   a charge pump coupled between the charge control output and a common node;
   a loop filter coupled to the common node;
   a first voltage-controlled delay line coupled between the reference input and the feedback input and having a first delay which is controlled by the common node;
   a second voltage-controlled delay line having a second delay which is controlled by the common node;
   a first multiplexer, which selectively couples the second delay line into and out of series with the first delay line between the reference input of the phase detector and the feedback input as a function of the test control input; and
   a second multiplexer, which alternately couples and decouples the normal reference input and the test input to and from the reference input of the phase detector as a function of the test control input.

2. The delay locked loop of claim 1 wherein:
   the first multiplexer couples the first delay line to the feedback input, bypassing the second delay line, when in the normal operating mode;
   the first multiplexer couples the first delay line to the feedback input through the second delay line when in the test operating mode; and
   the first select input is coupled to a test control input, which selects between the normal and test operating modes.

3. The delay locked loop of claim 1, wherein the first and second delay lines each comprises a delay control input, which is controlled by a voltage on the common node and wherein the delay locked loop further comprises:

an analog buffer coupled between the common node and the delay control input of the second delay line, which isolates the common node from added load by the second delay line.

4. The delay locked loop of claim 1, wherein:

the first and second delay lines each comprises a plurality of delay cells coupled in series with one another, wherein each delay cell has a current source, which supplies a current to the delay cell that is a function of a voltage on the common node; and the current sources in the second delay line comprise transistors with smaller gate widths than corresponding transistors in the first delay line.

5. A delay locked loop comprising:

a test reference input;

a normal reference input;

a normal operating mode and a test operating mode;

a test control input, which selects between the normal and test operating modes;

means for generating a voltage on a common node as a function of a phase difference between a reference input and a feedback input;

a first voltage-controlled delay line coupled between the reference input and the feedback input and having a first delay which is controlled by the voltage on the common node;

a second voltage-controlled delay line having a second delay which is controlled by the voltage on the common node;

means for selectively coupling the second delay line into and out of series with the first delay line, between the reference input and the feedback input, as a function of the test control input; and means for selectively coupling the normal reference input to the reference input of the means for generating during the normal operating mode and for alternatively coupling the test input to the reference input of the generating means during the test mode of the delay locked loop.

6. The delay locked loop of claim 5 wherein the means for selectively coupling the second delay line comprises a first multiplexer.

7. The delay locked loop of claim 6 wherein:

the first multiplexer couples the first delay line to the feedback input, bypassing the second delay line, when in the normal operating mode; and the first multiplexer couples the first delay line to the feedback input through the second delay line when in the test operating mode.

8. The delay locked loop of claim 5, wherein the first and second delay lines each comprises a delay control input, which is controlled by the voltage on the common node and wherein the delay locked loop further comprises:

means for isolating the common node from a load added by the second delay line.

9. The delay locked loop of claim 5, wherein:

the first and second delay lines each comprises a plurality of delay cells coupled in series with one another, wherein each delay cell has a current source, which supplies a current to the delay cell that is a function of the voltage on the common node; and the current sources in the second delay line comprise transistors with smaller gate widths than corresponding transistors in the first delay line.

10. A delay locked loop comprising:

a phase detector having a reference input, a feedback input and a charge control output;

a charge pump coupled between the charge control output and a common node;

a loop filter coupled to the common node;

a first voltage-controlled delay line coupled between the reference input and the feedback input and having a first delay, which is controlled by a first set of current source transistors coupled to the common node; and a second voltage-controlled delay line selectively coupled into and out of series with the first delay line, between the reference input and the feedback input, and having a second delay which is controlled by a second set of current source transistors coupled to the common node, wherein the second set of current source transistors have smaller gate widths than the first set of current source transistors.

11. The delay locked loop of claim 10, wherein:

the first and second delay lines each comprises a plurality of delay cells coupled in series with one another, wherein each delay cell comprises one of the current source transistors in the first set, which supplies a current to the delay cell that is a function of a voltage on the common node.

12. The delay locked loop of claim 10 and further comprising:

a first multiplexer, which selectively couples the second delay line in series with the first delay line as a function of a first select input.

13. The delay locked loop of claim 12 wherein:

the delay locked loop comprises a normal operating mode and a test operating mode;

the first multiplexer couples the first delay line to the feedback input, bypassing the second delay line, when in the normal operating mode;

the first multiplexer couples the first delay line to the feedback input through the second delay line when in the test operating mode; and the first select input is coupled to a test control input, which selects between the normal and test operating modes.

14. The delay locked loop of claim 13 and further comprising:

a test reference input;

a normal reference input; and a second multiplexer, which selectively couples the normal reference input to the reference input of the phase detector when the delay locked loop is in the normal operating mode or the test reference input to the reference input of the phase detector when the delay locked loop is in the test operating mode.

15. The delay locked loop of claim 10, wherein the first and second delay lines each comprises a delay control input, which is controlled by a voltage on the common node and wherein the delay locked loop further comprises:

an analog buffer coupled between the common node and the delay control input of the second delay line, which isolates the common node from added load by the second delay line.

* * * * *